April 11, 1967 J. O. BOWERS, JR 3,313,958

GATE CIRCUITRY UTILIZING MOS TYPE
FIELD EFFECT TRANSISTORS
Filed Sept. 3, 1965

INVENTOR.
John O. Bowers, Jr.

BY

B. B. Olive
ATTORNEY

United States Patent Office 3,313,958

Patented Apr. 11, 1967

3,313,958

GATE CIRCUITRY UTILIZING MOS TYPE FIELD EFFECT TRANSISTORS

John O. Bowers, Jr., Maitland, Fla., assignor, by mesne assignments, to General Dynamics Corporation, a corporation of Delaware Filed Sept. 3, 1965, Ser. No. 484,951
5 Claims. (Cl. 307—88.5)

This invention is generally concerned with gating circuitry and more specifically with gating circuits which use an MOS type field effect transistor as the gate. The invention finds application, for example, in an analog gate circuit in which an MOS type field effect transistor is being employed as the gating device.

The primary object of the invention is to provide means by which the gate and substrate terminals of an MOS type field effect transistor (MOSFET) may follow positive overvoltages accompanying input data so as to prevent the gate of the MOSFET from turning on under a positive overvoltage condition appearing at the source terminal of the MOSFET so as to prevent over dissipation of the MOSFET, it being noted that negative overvoltage tolerance at the MOSFET source terminal is limited by the breakdown voltage of the substrate-source junction within the MOSFET.

Another object is to prevent the gate of the MOSFET from turning on under a positive overvoltage appearing at the MOSFET source terminal while simultaneously blocking the transmission of a command input signal to the driver of the MOSFET so long as such positive overvoltage is present.

The foregoing and other objects of the invention will become apparent from the accompanying drawings and description in which a representative embodiment of the invention is shown applied to an analog gate circuit using a P channel enhancement mode MOSFET.

Figure 1:
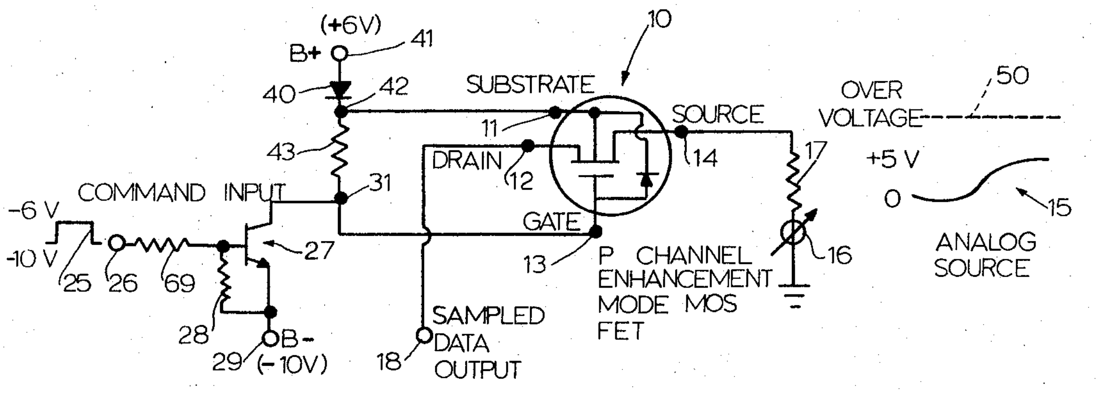
FIGURE 1 is a schematic diagram illustrating use of an isolating diode circuit for allowing an overvoltage applied at the MOSFET source terminal to be followed by the MOSFET gate and substrate terminals.

In FIGURE 1 the P channel enhancement mode MOSFET is schematically represented at 10. The respective substrate, drain, gate and source terminals are labeled accordingly and represented by the respective numerals 11, 12, 13 and 14. The analog input data signal is represented at 15 as coming from a representative analog source such as a transducer or the like 16 and which is fed to the MOSFET through a load resistor 17. In the embodiment being described it will be noted that the input data signal is shown as operating between typical zero and positive 5 volt levels. The desired sampled data output is fed to a suitable analog switching network, not shown, through an output terminal 18 connected to the drain terminal 12.

The gate, that is the MOSFET 10, is cut on and off under the influence of a suitable command input signal represented at 25 and in the present embodiment is illustrated with a typical range of operating values, namely, minus 10 volt and minus 6 volt levels. The command input signal 25 is fed through a driver circuit which is compatible with the specific nature of the type MOSFET being described and with the nature of the analog data input signal 15 and command input signal 25 being employed. This driver circuit includes an NPN transistor 27, a resistor 28, a resistor 69, and a B minus voltage source at terminal 29. The collector of transistor 27 is connected through a junction point 31 to the gate terminal 13 of MOSFET 10. The resistor 28 is connected between the base and emitter of transistor 27 and the B minus voltage at terminal 29 is connected to the emitter of transistor 27. The command input signal 25 is fed to the driver circuit through the base of transistor 27.

Of particular interest to the invention is the employment of an isolating diode 40. The anode of diode 40 is connected to the B positive voltage at terminal 41. The cathode of anode 40 connects to a junction point 42 which in turn connects to the gate terminal 13 of the MOSFET 10 through a resistor 43 and the previously referred to junction point 31. It will also be noted that the cathode of anode 40 connects through junction point 42 to the substrate terminal 11 of the MOSFET 10. Thus, the cathode of diode 40 is connected both to the gate terminal 13, through resistor 43, and to the substrate terminal 11 of the MOSFET 10. It is this particular feature of the circuitry of the invention which allows the gate and substrate of the MOSFET to follow an overvoltage input to the source terminal of the MOSFET and prevents the MOSFET gate from being inadvertently turned on under an overvoltage condition.

The operation of the circuit of FIGURE 1 will next be discussed to expalin how the gate and substrate terminals of the MOSFET follow any overvoltage present at the MOSFET source terminal to prevent the MOSFET gate from being turned on at such times. Following this explanation reference will be made to the composition of the FIGURE 2 circuit and as to how the FIGURE 2 circuit operates to block transmission of the command input signal whenever an overvoltage is present at the source terminal of the MOSFET gate.

With reference to FIGURE 1 it may be noted that tolerance of negative overvoltages applied at the source terminal 14 of the MOSFET 10 is limited by the breakdown voltage of the substrate to source junction within the MOSFET 10. Thus, since the invention provides protection against positive overvoltages appearing at the source terminal 14, it can be seen that a circuit according to the invention provides protection both against negative and positive overvoltages, the invention being primarily directed to the positive overvoltage problem. It may be noted that MOSFET 10 will conduct between source terminal 14 and drain terminal 12 whenever a positive input overvoltage, indicated in dotted lines at 50, in excess of approximately 10 volts is applied to the MOSFET source terminal 14. This value of 10 volts is explained by noting the sum of the B plus voltage of six volts at terminal 41 added to the $V_{GST}$ value (Gate-Source Threshold Voltage) where the $V_{GST}$ value for a typical MOSFET is 4 volts.

When the voltage applied at the MOSFET source terminal 14 exceeds the voltage level of the MOSFET substrate appearing at terminal 11 the source to substrate junction of MOSFET 14 becomes forward biased. As the voltage applied at the MOSFET source terminal 14 increases above this level the voltage appearing at the MOSFET substrate terminal 11 will follow. Assuming diode 40 is not employed in such condition the overvoltage signal applied at the MOSFET source terminal 14 would be shorted out through the source to substrate junction and would subject MOSFET 10 to overdissipation and damage. With diode 40 present, diode 40 becomes reversed biased and the voltage at the MOSFET substrate terminal 11 can follow the overvoltage signal applied at the MOSFET source terminal 14 while maintaining isolation between the MOSFET substrate terminal 11 and the B plus voltage appearing at terminal 41.

The potential of MOSFET substrate terminal 11, in addition to being applied across diode 40, is also applied to the MOSFET gate terminal 13 through resistor 43. This keeps the voltage between the gate terminal 13 and the source terminal 14 of MOSFET 10 below the $V_{GST}$ value and MOSFET 10 will not conduct until the substrate to drain voltage or the gate to drain breakdown voltage is exceeded, whichever occurs first. This circuit arrangement allows the MOSFET 10 to remain non-conducting when large values of positive overvoltage are present at the MOSFET source terminal 14 irrespective of whether or not there is present the indicated bias voltage of 6 volts positive at terminal 41. Thus, the necessary condition for avoiding overdissipation of the MOSFET is that the substrate and gate potentials be allowed to follow the source potential. If the substrate potential does not follow the source potential the MOSFET is subject to overdissipation. If the substrate potential follows the source potential but the gate potential does not, the MOSFET will conduct between its source and drain terminals when the source terminal becomes sufficiently positive with respect to the gate potential. The presence of diode 40 and the connection between diode 40 and the MOSFET gate terminal 13 through resistor 43 meets the problems presented since the voltage level of the cathode of diode 40 can rise above the bias voltage applied at terminal 41 and since the potential at the MOSFET gate terminal 13 will naturally follow through the connecting link provided by resistor 43.

Figure 2:
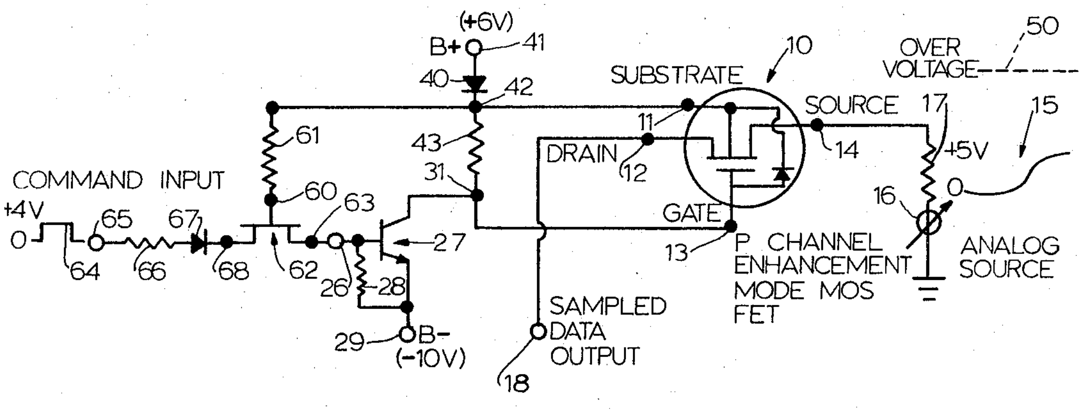
FIGURE 2 illustrates additional circuitry used with the FIGURE 1 circuit to block transmission of the command input signal so long as an overvoltage signal is present at the MOSFET source terminal.

The foregoing assumes there is no command input signal 25 effective to turn the driver transistor 27 on. That is, it is desirable to protect the MOSFET 10 from overdissipation brought about by an overvoltage applied at its source terminal 14 both in the condition when the command signal driver circuit is off as well as in the condition when it is on. Thus, assuming the command signal driver circuit, i.e. transistor 27, is on and the potential at the gate terminal 13 of MOSFET 10 is driven to the B minus level of minus 10 volts indicated at terminal 29, MOSFET 10 will conduct between its source terminal 14 and drain terminal 12. Any overvoltage signal present at such time at the MOSFET source terminal 14 will be transmitted to the MOSFET output terminal 18 thus subjecting MOSFET 10 to overdissipation or overdriving of the output circuitry connected to output terminal 18. The invention in the circuitry of FIGURE 2 provides means for blocking transmission of the command input signal 25 at such times. Irrespective of whether the driver circuit which includes transistor 27 is on or off it should be noted that the FIGURE 1 circuitry operates and overvoltage signal level at MOSFET source terminal 14 tends to cause the levels at the substrate and gate terminals of MOSFET 10 to move to the same level. When the driver circuit is off such tendency to follow the overvoltage signal level prevents conduction between the source and drain terminals of MOSFET 10. However, when the driver circuit is on such tendency to follow is overcome by the fact that the potential of the MOSFET gate terminal 13 is brought down to the B minus potential.

In FIGURE 2, the circuit of FIGURE 1 is repeated and the same identifying numerals and labels are applied. Reference will be made primarily to those elements in FIGURE 2 which do not appear in FIGURE 1. At the outset it may be said that the general purpose of the added elements in FIGURE 2 is to provide means for utilizing the potential of the substrate terminal 11 of MOSFET 10 to block transmission of the command input signal through the driver circuit provided by transistor 27 whenever a positive overvoltage signal is present at the MOSFET source terminal 14. In FIGURE 2 the junction point 42 previously referred to is connected through a resistor 61 to the gate terminal 60 of a P channel junction field effect transistor 62. The drain terminal 63 of transistor 62 is connected to terminal 26 which as previously referred to is connected to the base of transistor 27. The command input signal 64 is in case of FIGURE 2 indicated as being introduced through terminal 64, through a resistor 66 and a diode 67 to the source terminal 68 of the P channel field effect transistor 62. Typical operating values for the command input signal 64 as introduced at terminal 64 are shown as being zero volts below which transistor 62 is off and plus 4 volts above which transistor 62 is on. Such values when taken with the typical P channel junction field effect characteristic give the desired operating range of zero and four volts positive at terminal 26.

The circuitry which includes resistor 61, transistor 62, resistor 66 and diode 67 can be seen to be, in effect, a gate for transmitting and blocking the command input signals presented at terminal 65 and which gate responds to the voltage level at terminal 42. Thus, when an overvoltage signal, due to a positive overvoltage at the MOSFET source terminal 14, appears at terminal 42 which is connected to the MOSFET substrate terminal 11, such overvoltage signal is transferred to the gate terminal 60 as a bias voltage. As a consequence, transistor 62 is prevented from conducting even when command signal 64 is present at terminal 65 and hence transistor 27 in the driver circuit for MOSFET 10 is prevented from being turned on.

In summary, it can be seen that the circuitry of the invention provides overdissipation protection from positive overvoltages presented at the source terminal of an MOS type field effect transistor. Further, such protection is provided both in the condition when a command signal input is being received which would normally turn the MOSFET on as well as in the condition when the command signal is off. In both conditions the circuitry of the invention prevents overdissipation of the MOSFET.

Having described the invention, what I claim is:

1. In combination with a gating circuit which includes an MOS type field effect transistor having source, substrate, drain and gate terminals:

(a) a B positive bias supply, (b) a diode having its anode connected to said bias supply and its cathode connected to said substrate terminal, (c) a current limiting resistor connected between said diode cathode and said gate terminal, and (d) a command input and drive circuit connected to said gate terminal whereby when said source terminal is subjected to a positive overvoltage and irrespective of the condition of said command input and driver circuit whether on or off, the level of said overvoltage is transferred to said substrate and gate terminals and acts to oppose the establishment of a conducting path between said source and drain terminals.

2. In combination with a first gating circuit which includes an MOS type field effect transistor having source, substrate, drain and gate terminals:

(a) a B positive bias supply, (b) a diode having its anode connected to said bias supply and its cathode connected to said substrate terminal, (c) a current limiting resistor connected between said diode cathode and said gate terminal, (d) a driver circuit connected to said gate terminal and effective when operative to cause a conducting path to be established between said source and drain terminals, (e) a command signal input source productive of command signals effective to make said driver circuit operative, and (f) a second gating circuit connected to provide a path when on between said command signal input source and said driver circuit, said gating circuit having a gating terminal connected to said diode cathode, whereby when said source terminal is subjected to a positive overvoltage at a time when said command signals are present said gating circuit is kept off in response to said overvoltage level appearing at said diode cathode and the levels of said substrate and gate terminals of said MOS type field effect transistor are caused to move toward said overvoltage level to oppose turning on of said MOS type field effect transistor and to oppose the establishment of a conducting path between said source and drain terminals.

3. In the combination claimed in claim 2 wherein said second gating circuit includes a junction type field effect transistor and said gating terminal comprises the gating terminal of said junction type field effect transistor.

4. In the combination claimed in claim 2 wherein said MOS field effect transistor comprises a P channel enhancement mode MOS type field effect transistor and said second gating circuit includes a P channel junction type field effect transistor and said gating terminal comprises the gating terminal of such junction transistor.

5. The combination with a first gating circuit which includes an MOS type field effect transistor having source, substrate, drain and gate terminals which comprises, (a) a diode having its anode connected to said bias supply and its cathode connected to said substrate terminal, (b) a current limiting element connected between said diode cathode and said gate terminal, (c) a driver circuit connected to said gate terminal and effective when operative to cause a conducting path to be established between said source and drain terminals, (d) a command signal input source productive of command signals effective to make said driver circuit operative, and (e) a second gating circuit connected to provide a path when on, between said command signal input source and said driver circuit, said gating circuit having a gating terminal connected to said diode cathode, whereby when said source terminal is subjected to an overvoltage at a time when said command signals are present, said gating circuit is kept off in response to said overvoltage level appearing at said diode cathode and the levels of said substrate and gate terminals of said MOS type field effect transistor are caused to move toward said overvoltage level to oppose turning on of said MOS type field effect transistor and to oppose the establishment of a conducting path between said source and drain terminals.

No references cited.

ARTHUR GAUSS, *Primary Examiner.*

J. BUSCH, *Assistant Examiner.*